United States Patent [19]
Yamazaki et al.

[11] Patent Number: 4,676,404
[45] Date of Patent: Jun. 30, 1987

[54] METHOD AND APPARATUS FOR FEEDING DRUG LIQUID FROM HERMETIC RETURNABLE CAN

[75] Inventors: Masahiro Yamazaki; Shigeru Iizuka, both of Yokohama; Shigemitsu Kamiya, Kawasaki; Yoshiro Oka; Katsuhiro Fujino, both of Yokohama, all of Japan

[73] Assignees: Nippon Zeon Co., Ltd., Tokyo; Fujitsu Limited, Kanagawa, both of Japan

[21] Appl. No.: 660,412

[22] Filed: Oct. 12, 1984

[30] Foreign Application Priority Data

Oct. 17, 1983 [JP] Japan ................. 58-192514
Oct. 17, 1983 [JP] Japan ................. 58-192515

[51] Int. Cl.$^4$ ........................................... B67D 5/00
[52] U.S. Cl. ............................. 222/56; 222/61; 222/66; 222/399; 137/208; 137/209; 137/212
[58] Field of Search ............. 222/61, 56, 65, 66, 222/399, 284, 64, 182; 137/208, 209, 212, 213; 118/429

[56] References Cited

U.S. PATENT DOCUMENTS

| | | | |
|---|---|---|---|
| 1,733,106 | 10/1929 | Cannon | 222/182 |
| 3,535,124 | 10/1970 | Cornelius . | |
| 3,612,090 | 10/1971 | Kassel | 137/209 |
| 3,804,297 | 4/1974 | Jurjans | 222/64 |
| 3,805,819 | 4/1974 | Etter | 137/208 |
| 3,878,970 | 4/1975 | Nezworski | 222/61 |
| 3,909,205 | 9/1975 | Jones . | |
| 4,370,356 | 1/1983 | Bok et al. | 118/429 |
| 4,377,246 | 3/1983 | McMillin et al. | 222/56 |
| 4,545,801 | 10/1985 | Miyajiri et al. | 137/209 |

FOREIGN PATENT DOCUMENTS

| | | | |
|---|---|---|---|
| 2535182 | 2/1977 | Fed. Rep. of Germany . | |
| 2035598 | 12/1970 | France . | |
| 59-21021 | 2/1984 | Japan . | |
| 8001797 | 9/1980 | World Int. Prop. O. | 222/61 |

Primary Examiner—H. Grant Skaggs
Attorney, Agent, or Firm—Weingarten, Schurgin, Gagnebin & Hayes

[57] ABSTRACT

An apparatus for feeding a variety of doping liquid used in doping-liquid treatment processes for electronic materials such as semiconductors and precision machinery components, and a feeding monitor apparatus. More specifically, it relates to an apparatus for stably feeding the doping liquid while detecting its volume, in the case where the doping liquid is fed from a liquid-filled hermetic returnable can to the doping liquid treatment process, and a feeding monitor apparatus is connected between the returnable can and treatment process.

10 Claims, 10 Drawing Figures

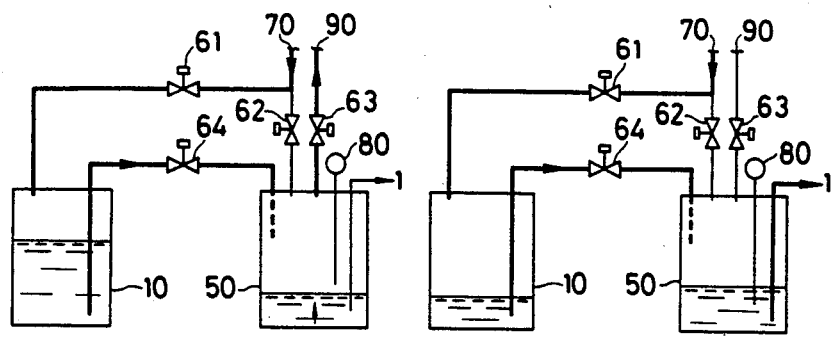
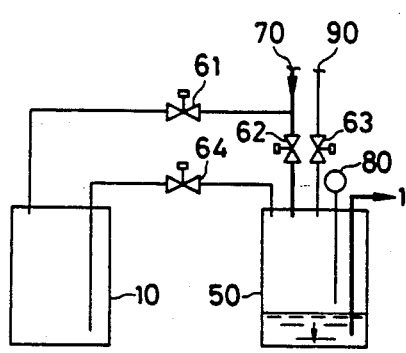
FIG.7  FIG.8  FIG.9  FIG.10

METHOD AND APPARATUS FOR FEEDING DRUG LIQUID FROM HERMETIC RETURNABLE CAN

BACKGROUND OF THE INVENTION

The techniques used in the manufacture of integrated circuits, transistors, and the like require that the quality of doping liquids used in their manufacture be carefully controlled. Particularly, the inclusion of fine particle contaminants into the doping liquid must be prevented, since such an inclusion has a direct influence on the yield of the products. For this reason, the liquid is usually precisely filtered, and clean containers are filled with the filtered liquid in a purified environment (i.e., a clean room). The containers generally employed are 1 to 8-liter glass bottles.

The operation of opening and filling the glass bottles with the doping liquid is carried out in a clean room. Although some incorporation of dust, contaminents, and the like into the doping liquid is inevitable, the amount is not as great as would be present if the filling were done outside the clean room. A further disadvantage to the use of glass bottles is that the containers are liable to break in the course of transport and distribution and disposal of the used empty containers is also burdensome because the are not reusable.

As far as the users of the doping liquid are concerned, it is also troublesome to open the glass bottle and transfer the doping liquid therein into another container for use in the manufacturing device because during the transfer dust and other contaminants may get into the contents of the bottle. In extreme cases, the contents may spill or overflow.

In view of such inconveniences, the inventors of the present application developed a returnable can, i.e., a receiving container for the doping liquid, which could be easily connected to a pipe which leads to the doping liquid treatment process without opening the returnable can and without transferring the liquid therein into another container each time it is used.

This receiving container is constructed so that the doping liquid therein may be fed to a semiconductor-manufacturing device by utilizing gas pressure, as disclosed in Japanese Patent Provisional Publication No. 21021/1984.

FIGS. 1-3 attached hereto are prior art devices showing the receiving container and an arrangement by which the receiving container is connected to the semiconductor-manufacturing device.

As shown in FIG. 1, a canister 10 which is a returnable can including doping liquid 20 is composed of a liquid receiving container body 13 and a flange 14, which is provided with a coupler 11 for allowing the liquid to be transported therethrough and a male coupler 12 for allowing a gas to pass therethrough. In FIG. 2, these couplers 11, 12 are protected by caps 30 and 31, respectively.

In the case where the returnable can is connected to a semiconductor-manufacturing device 1, a purified nitrogen gas is fed to the canister 10 through couplers 17, 12, and the drug liquid 20 is delivered to the device 1 through the couplers 16, 11 by virtue of the nitrogen gas pressure, as exhibited in FIG. 3.

Such a returnable can may receive a greater amount of the doping liquid than a conventional glass bottle, however, the volume of the doping liquid cannot be monitored, depending on the material used for the returnable can. Further, since a larger amount of the doping liquid is contained therein, it is difficult to always monitor its remaining volume and exchange the depleted bottle for a new one at the proper time, and if a worker is not conscious of the liquid's absence in the bottle and if the doping liquid treatment device continues to operate, untreated inferior goods will be manufactured. Even if a metering instrument is mounted to the semiconductor-manufacturing device, for detecting a decrease in the volume of the liquid, such as an integrating flowmeter, it will be exceedingly difficult to quickly exchange the empty returnable can for a new one.

SUMMARY OF THE INVENTION

The present invention provides an apparatus by which the above-mentioned drawbacks can be overcome; a doping liquid can be fed, monitoring its volume without bringing the liquid into contact with the outside air, while keeping its clean state; when the volume of the doping liquid decreases below a predetermined level, warning will be given; and even during the exchange of the empty returnable can for a new one, the doping liquid can continuously feed without halting the flow of doping liquid into the manufacturing device.

According to the present invention, the doping liquid is delivered from a hermetic returnable can be means of a liquid surface pressurizing system, and for this purpose, a liquid level monitor tank is interposed between the hermetic returnable can and a doping treatment process. The liquid is transported through this monitor tank, and after the returnable can is empty, the liquid in this monitor tank is used and when the level of the liquid in the monitor tank reaches a predetermined position, warning will be given as a signal to exchange the returnable cans. Further, a pipe between the returnable can and the monitor tank is adapted to be shut off so that a liquid surface pressurizing gas may be introduced into the monitor tank, during the exchange of the returnable cans, to pressurize the surface of the liquid in the monitor tank and to thereby continue the feeding of the doping liquid to the manufacturing process. By virtue of the above-mentioned construction, the continuous feeding of the doping liquid is possible, even while a new returnable can is being delivered and connected to the monitor tank. In short, by connecting, to the monitor tank, a source of the gas for pressurizing the surface of the liquid in the returnable can, the monitor tank possesses the role as a warning instrument and functions as a cushion tank at the time of the exchange of the cans.

The present invention is an apparatus which comprises a monitor tank disposed between a hermetic returnable can and a doping liquid treatment process; a means for delivering the doping liquid in the hermetic returnable can to the doping liquid treatment process through the monitor tank by a liquid surface pressurizing system; a means for detecting a volume of the doping liquid in the hermetic returnable can from a liquid level of the doping liquid in the monitor tank and for warning as to the need to exchange for a new hermetic returnable can; and a means for continuing the delivery of the doping liquid to the doping liquid treatment process by the use of the doping liquid in the monitor tank, whereby the doping liquid is successively fed from the hermetic returnable can to a manufacturing device which performs the doping liquid treatment process.

BRIEF DESCRIPTION OF THE DRAWINGS

FIGS. 7–9 are schematically illustrative views to illustrate the doping liquid feeding method of the present invention; and FIG. 10 is a schematic sectional elevation showing another embodiment of the apparatus according to the present invention.

DETAILED DESCRIPTION OF THE INVENTION

Figure 2:
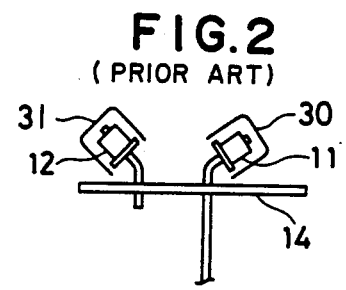
FIG. 2 is an elevational view showing a flange and couplers attached to the returnable can body of FIG. 1.
Figure 3:
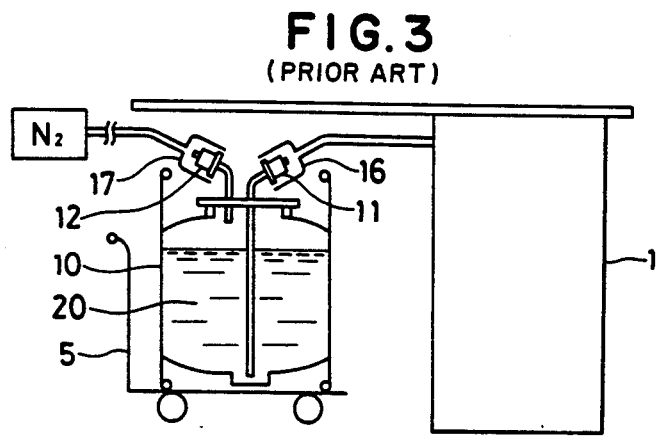
FIG. 3 is an illustrative view showing schematically a known prior art connection means between the returnable can and a manufacturing device.

The present invention will be described in detail in reference to embodiments shown by FIGS. 4–10. It is to be noted that a hermetic returnable can, couplers, a manufacturing machine, and the like will be represented by the same reference numerals as in FIGS. 1–3.

Figure 1:
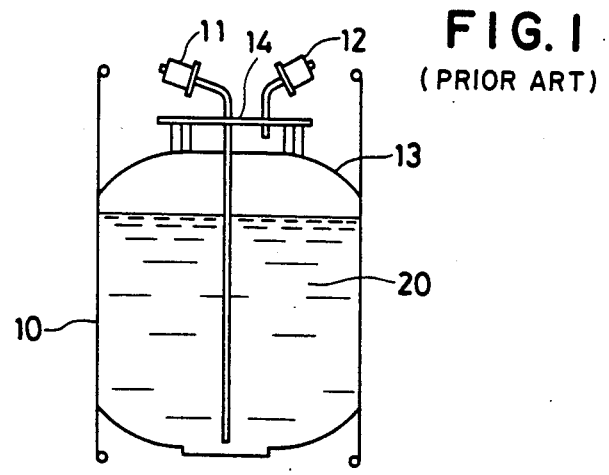
FIG. 1 is a schematic elevational view of a known prior art hermetic returnable can used in the present invention.
Figure 4:
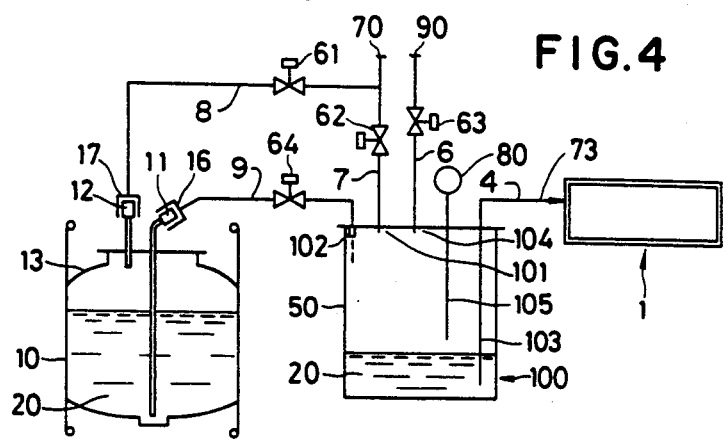
FIG. 4 is a schematic sectional elevational of the doping liquid feeding apparatus of the present invention.

The doping liquid feeding monitor apparatus 100 used in the present invention, shown in FIG. 4, comprises a monitor tank 50 for receiving a predetermined amount of a doping liquid 20, a level gauge 80 for detecting a level position of the drug liquid in the monitor tank 50, a connecting hole 70 of a gas supply pipe 7 with electromagnetic valve 62 for introducing a gas which applies a pressure in order to feed the doping liquid during a certain period of time, a connection hole 90 of a gas discharge pipe 6 with electromagnetic valve 63 for discharging a gas (i.e., nitrogen) present in the tank, a returnable canister 10 as shown in FIG. 1 as well as a liquid supply pipe 9, with electromagnetic valve 64 between coupler 16, to transport the doping liquid from the canister 10 to the monitor tank 50 and a second gas supply pipe 8 with electromagentic valve 61 to allow gas going into connection hole 70 to flow to coupler 17 and into canister 10 such that surface pressure is applied to liquid 20 in canister 10. Electromagnetic valves 61, 62, 63, 64 are used for switching circuits of the nitrogen gas and the doping liquid, female couplers 17, 16 are used for connecting the monitor apparatus to a canister 10 which is a returnable can, and a connection hole 73 of a liquid transport pipe 4 is utilized for feeding the doping liquid to a semiconductor-manufacturing device 1. Circuits for feeding electric power to the electromagnetic valves 61, 62, 63, 64 and the level gauge 80, an operation switch on a dashboard (not shown), and a circuit for feeding electric power can also be incorporated.

The principle of the apparatus of the present invention is as follows: by virtue of the presence of the nitrogen gas, the doping liquid in the canister 10 is fed to the monitor tank 50 of the apparatus, and the liquid is maintained at a predetermined position of detecting the liquid level with the aid of the level gauge 80 and the doping liquid is delivered from the monitor tank 50 to the device 1. Further, when the amount of the doping liquid decreases by using it and the canister 10 becomes empty, and when the level of the liquid in the monitor tank 50 is below a predetermined position, the level gauge 80 detects this fact and gives the alarm, whereby a worker is conscious that the canister 10 is empty and exchanges the empty canister for a new one. Another feature of the present invention permits continuous driving of the semiconductor-manufacturing device 1 even during the exchange of the canisters.

Figure 5:
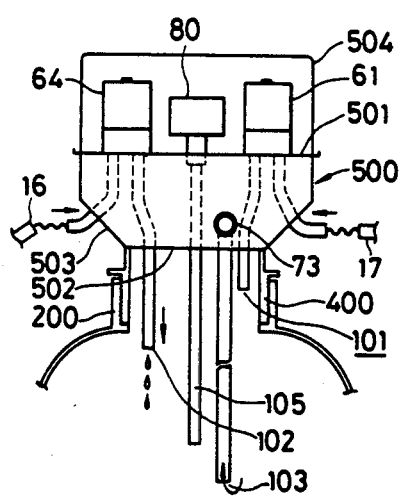
FIG. 5 is a partially sectional elevation of the upper portion of a monitor tank.
Figure 6:
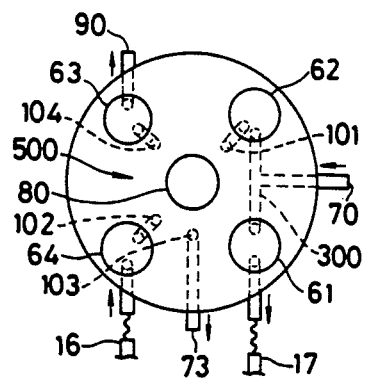
FIG. 6 is a plan view of the upper portion of the monitor tank.

As shown in FIGS. 5 and 6, the above-mentioned electromagnetic valves 61, 62, 63, 64 and a head of the level gauge 80 are mounted on a seating plate 501 of a pedestal 500 which is disposed on the monitor tank 50.

The above-mentioned pedestal 500 has the shape of a substantially inverted truncated cone, and is adapted to be detachably coupled to the monitor tank 50 by screwing an external thread 400 of the pedestal 500 into an internal thread 200 inside the neck portion of the monitor tank 50. Therefore, the pedestal 500 and the monitor tank 50 are airtightly linked to each other.

The pedestal 500 is covered with a hood 504 to protect the electromagnetic valves and the level gauge. A pipe for receiving the doping liquid from the returnable can extends from the outside to the inside of the monitor tank 50 through a slanting side wall 503 of the pedestal 500, the electromagnetic valve 64 being mounted to the pedestal 500. The above-mentioned pedestal 500 is disposed between the seating plate 501 and a lower partition plate 502 of the pedestal 500. The above pipe is provided, on its one free end outside the monitor tank 50, with a connection to the coupler 16 while its other free end is inside the monitor tank 50, with another connection hole 102. A pipe for delivering the doping liquid extends from the bottom portion in the monitor tank 50 to the outside of the tank 50 through the partition plate and the side wall, and the pipe has an opening 103 at its one free end inside the monitor tank 50 and a connection hole 73 at its other free end outside the tank 50. A pipe for introducing a pressurized air extends from the outside to the inside of the pedestal 500 and branches into two passages therein, one which extends therefrom to the outside of the pedestal 500 through the electromagnetic valve 61 and the side wall 503 and another which extends therefrom to the inside of the monitor tank 50 through the electromagnetic valve 62 and the lower partition plate. The branched pipes have the coupler 17 at its one free end outside the monitor tank 50 and have a connection hole 101 at its other free end inside the monitor tank 50. The gas in the tank is discharged from a connection hole 104 through the bottom partition plate, the electromagnetic valve 63, the side wall 503 and the connection hole 90. A detecting portion 105 of the level gauge 80 is inserted into the monitor tank 50 through the lower partition plate 502.

According to the monitor apparatus constituted as described above, the connections of the respective pipes are all carried out through the side wall of the pedestal, therefore less space is taken up and operation can be done very conveniently. Further, the connection with a nitrogen source is sufficiently accomplished at only one position, and since the feeding of the nitrogen gas to the canister and the handling of the valves are carried out on the monitor tank, these operations are fairly easy. Furthermore, the level gauge and the electromagnetic valves are mounted all together on the pedestal so that they may be accordingly checked and maintanance can conveniently be carried out.

The operation of feeding the doping liquid by the use of the above-mentioned apparatus will be described in detail in reference to FIGS. 7–9. Bold lines shown in these drawings means established circuits.

The male couplers 12, 11 of the canister 10 are coupled to the female couplers 17, 16 of the apparatus 100. The purified nitrogen gas having 0.5 to 1.0 kg/cm G is introduced through the connection hole 70. A desired electric power source can be fed into the present invention (FIG. 6).

A starting button (not shown) on a dashboard is pushed to start the operation of the apparatus. As shown in FIG. 7, the level gauge 80 detects the volume of the liquid in the monitor tank 50 to see if it is below the predetermined level, and, if it is the electromagnetic valve 61 opens and the pressure is applied to the canister 10. Simultaneously, the electromagnetic valve 64 opens to complete the circuit of the doping liquid. When the electromagnetic valve 63 on the pipe for discharging the gas in the tank opens, the doping liquid in the returnable can is automatically delivered to the monitor tank 50 with the aid of the pressure of the nitrogen gas (this condition is hereinafter referred to as "during filling").

When the level of the liquid in the monitor tank 50 reaches a predetermined position as shown in FIG. 8, the level gauge detects this fact and the electromagnetic valve 63 and the connection hole 90 on the pipe for discharging the gas in the tank are closed. The level of the liquid in the tank rises until the pressure of the nitrogen gas is equivalent in both the canister and monitor tank, thus preventing an increase in the volume of liquid in the monitor tank. So long as the liquid is present in the canister 10, this state is retained as steady-state, and the use of the doping liquid is begun into the semiconductor-manufacturing device 1 (this state will be hereinafter referred to as "during using").

While the doping liquid is used in the device 1, the liquid in the canister 10 continuously runs into the monitor tank 50, and when the canister 10 is empty at last, as shown in FIG. 9, the level of the liquid in the monitor tank 50 begins to lower. When the level of the liquid in the monitor tank goes below a predetermined position, the level gauge 80 detects it, and the alarm is given and a sign appears on the dashboard (this state is hereinafter referred to as "empty").

Simultaneously, the electromagnetic valves 61, 64 close as shown in FIG. 9 cut off the circuit between the canister 10 and the monitor tank 50, and the electromagnetic valve 62 opens in order to allow the pressure of the nitrogen gas to be applied to the monitor tank 50, whereby the remaining liquid in the monitor tank 50 is ready to be used. Since the opened lower end of the pipe for feeding the doping liquid lies in the vicinity of the bottom of the monitor tank, the doping liquid can continuously be used as long as it is present therein.

In response to the alarm, a worker exchanges the empty canister for a new full canister while liquid still remains in the monitor tank 50.

Afterward, when a reset button (not shown) on the dashboard is pushed, the above-mentioned "during filling" state returns and the introduction of the doping liquid from the canister 10 into the monitor tank 50 begins. At this time, the electromagnetic valve 63 of the monitor tank 50 and the connection hole 90 of the gas (nitrogen) discharging pipe are opened, so that the pressure in the monitor tank 50 decreases. However, a flow rate of the gas through the connection hole 90 on the gas discharge pipe is adjusted by forming orifices or the like so that it may be smaller than the flow rate of the liquid which is introduced from the canister thereinto and so that the pressure in the monitor tank 50 is greater than atmospheric pressure, a pipe resistance and a head difference. Therefore, even in the above-mentioned state, the successive use of the doping liquid is feasible in the semiconductor-manufacturing device 1.

FIG. 10 shows another embodiment of the present invention, in which the canister 10 can be accommodated under a trestle 200 on which the apparatus 100 of the present invention is put. According to this embodiment, the occupied floor area can be diminished to obtain a compact structure, and the connecting operation can easily be carried out. In the convenient embodiment above, the canister 10 can be drawn from the receiving section under the thresltle while laid on a cart 5, and after the completion of the coupler connections, the canister 10 can be pushed thereinto again by the utilization of the cart 5.

As understood from the above, the present invention is connected with the method for feeding the doping liquid and the apparatus for monitoring the feeding of the doping liquid in which the successful control of the pressure in the monitor tank 50 advantageously permits not only giving the alarm in response to a low liquid volume but also permits the continuous use of the device 1 even during the exchange of the canister 10.

In view of the principle of the present invention, level gauge 80 may be an electrostatic capacity type level gauge, a float type level gauge, a phototube type level gauge or the like in compliance with its application field. Further, in place of the electric power, an air pressure driving system may be employed. The present invention does not put any restriction on the selection of such systems.

According to the principle of the present invention, when the rising level of the doping liquid in the monitor tank 50 reaches an equilibrium by virtue of the pressure in the monitor tank, the level gauge will give the alarm signal. Therefore, one level gauge sufficies to accomplish the function of detecting the predetermined level, but two level gauges may also be employed to detect two points such as a lower level and a higher level of the doping liquid.

Other various embodiments can be conceived, but in short, according to the present invention, the canister, which is the returnable can, is connected to the semiconductor-manufacturing device via the doping liquid feeding monitor apparatus in order to permit the warning of an absence of the doping liquid in the canister and signaling the time for exchanging the canisters, and while feeding of the doping liquid to the semiconductor-manufacturing device continues even during exchanging the canisters. Thus, the present invention is not limited at all by the detecting manner of the liquid level.

Materials used in the present invention include neither those which are corroded to produce a contaminant such as rust or such materials as are attacked by the doping liquid or materials which can dissolve or disperse therein to contaminate the doping liquid. Therefore, the materials which will be employed must be tested in accordance with usual procedures to see if they are suitable for use with the doping liquid. Typical examples of the materials used in the present invention include SUS 304, SUS 316, teflon, polypropylene, polyethylene, polyvinyl chloride, SUS 304 and SUS 316 lined with teflon, and plastics of polypropylene reinforced with fiber. However, the materials acceptable in this invention should be selected in consideration of the properties of the doping liquid to be used. It is intended that these materials do not limit the present invention at all.

What is claimed is:

1. An apparatus for feeding a doping liquid from a hermetic reusable canister to a monitor tank from which the liquid is fed into a manufacturing device, comprising:

a gas supply source;

a reusable canister with a top, sides, and bottom;

a monitor tank having a bottom, sides, and a top with an opening including a neck; and a lid capable of being mounted to said monitor tank at the opening of said monitor tank such that a seal is provided between said lid and the neck of said opening, said lid further comprising:

a liquid supply member to provide for fluid communication between said canister and said monitor tank, said supply member having first and second ends, valve means, and detachable coupling means, said first end of said supply member extending from said lid into said monitor tank, and said second end of said supply member extending through the top of and into said canister to a position just above the bottom of said canister, said liquid supply member valve means operable as a function of the level in the monitor tank to be open while doping liquid continues to flow through the liquid supply member and closed when the reusable canister is substantially empty;

a means for detecting the fluid level in said monitor tank;

a liquid transport member to provide for fluid communication between said monitor tank and a manufacturing device, said transport member having first and second ends, said first end of said transport member extending from the lid into said monitor tank to a position just above the bottom of said monitor tank, and said second end of said transport member being connected to said manufacturing device;

a gas discharge conduit to allow for the release of gas from said monitor tank, said gas discharge conduit having first and second ends and valve means, said first end of said gas discharge conduit extending from said lid into said monitor tank, and said second end of said gas discharge conduit being open to an environment external to said monitor tank, said gas discharge conduit valve means operable as a function of the level in the monitor tank to be open when the volume of doping liquid in said monitor tank is being increased by a flow of the doping liquid from the reusable canister to the monitor tank via the liquid supply member and closed when a desired level of doping liquid is reached in the monitor tank;

a first gas member for injecting gas into said canister, said first gas member having first and second ends, valve means, and detachable coupling means, said first end of said first gas member extending from said lid through the top of and into said canister, and said second end of said first gas member connected to said gas supply source, said first gas member valve means being operable as a function of the level in the monitor tank to be open in order to force the doping liquid from the reusable cansiter while doping liquid continues to flow from the reusable canister through the liquid supply member and closed when the reusable canister is substantially empty; and a second gas member for injecting gas into said monitor tank, said second gas member having first and second ends and valve means, said first end of said second gas member extending from said lid into said monitor tank, and said second end of said second gas member connected to said gas supply source, said second gas member valve means being operable as a function of the level in the monitor tank to be open so as to force doping liquid from the monitor tank when said reusable canister is substantially empty, and said liquid supply valve means and said first gas member valve means are in a closed position and closed when doping liquid is flowing through from the reusable canister to the monitor tank via the liquid supply member.

2. The liquid feeding apparatus according to claim 1 wherein said gas supply source is a nitrogen gas supply source.

3. The liquid feeding apparatus according to claim 1 wherein said monitor tank neck has a threaded portion and said lid has a flange with a complementary threaded portion such that said lid can be screwably mounted to said monitor tank.

4. The liquid feeding apparatus according to claim 1 wherein said lid further includes a pedestal to which are mounted said liquid supply member valve means, said fluid level detecting means, said gas discharge conduit valve means, said first gas member valve means, and said second gas member valve means.

5. The liquid feeding apparatus according to claim 4 further including a hood to cover said pedestal.

6. The liquid feeding apparatus according to claim 1 wherein said manufacturing device is a semiconductor manufacturing device.

7. The liquid feeding apparatus according to claim 1 wherein said fluid level detecting means includes an electrostatic capacity type level gauge.

8. The liquid feeding apparatus according to claim 1 wherein said fluid level detecting means includes a float type level gauge.

9. The liquid feeding apparatus according to claim 1 wherein said fluid level detecting means includes a phototube level gauge.

10. The liquid feeding apparatus according to claim 1 wherein said fluid level detecting means includes a first level sensing means to detect a first liquid level and a second level sensing means to detect a second liquid level below said first liquid level.

* * * * *